United States Patent
Dubey

(10) Patent No.: US 7,646,234 B2
(45) Date of Patent: Jan. 12, 2010

(54) INTEGRATED CIRCUIT AND METHOD OF GENERATING A BIAS SIGNAL FOR A DATA SIGNAL RECEIVER

(75) Inventor: Hari Bilash Dubey, Munich (DE)

(73) Assignee: Qimonda AG, Munich (DE)

( * ) Notice: Subject to any disclaimer, the term of this patent is extended or adjusted under 35 U.S.C. 154(b) by 139 days.

(21) Appl. No.: 11/858,240

(22) Filed: Sep. 20, 2007

(65) Prior Publication Data

US 2009/0080570 A1 Mar. 26, 2009

(51) Int. Cl.
G05F 1/02 (2006.01)
G05F 3/16 (2006.01)
(52) U.S. Cl. .................. 327/538; 327/541; 323/314
(58) Field of Classification Search .......... 327/530, 327/538–541; 323/314
See application file for complete search history.

(56) References Cited

U.S. PATENT DOCUMENTS

| | | | | |
|---|---|---|---|---|
| 6,424,585 | B1 * | 7/2002 | Ooishi | 365/226 |
| 6,791,308 | B2 * | 9/2004 | Shim | 323/314 |
| 6,927,557 | B2 * | 8/2005 | Proll et al. | 323/312 |
| 7,450,361 | B2 * | 11/2008 | Ito et al. | 361/93.1 |
| 2005/0093581 | A1 * | 5/2005 | Kang | 327/73 |

* cited by examiner

*Primary Examiner*—Dinh T. Le
(74) *Attorney, Agent, or Firm*—Dicke, Billig & Czaja, PLLC

(57) ABSTRACT

An integrated circuit and method of generating a bias signal for a data signal receiver is disclosed. One embodiment provides a replica circuit configured to generate a feedback signal, wherein the replica circuit is a replica of at least a part of a data signal receiver, and wherein the feedback signal depends on a reference signal of the data signal receiver. A compensation circuit is configured to compensate an influence of the reference signal on the feedback signal. An amplifier circuit is configured to generate a bias signal based on the feedback signal, the bias signal being provided to the data signal receiver.

13 Claims, 9 Drawing Sheets

_US 7,646,234 B2_

INTEGRATED CIRCUIT AND METHOD OF GENERATING A BIAS SIGNAL FOR A DATA SIGNAL RECEIVER

BACKGROUND

Receiver circuits integrated on a semiconductor chip may be constructed as differential receiver circuits to convert data from a low swing non-return-to-zero signal voltage (NRZ signal voltage) to full-swing CMOS levels. In most receiver circuits this NRZ signal voltage varies across a reference voltage VREF. As this reference voltage for the data receivers can vary, data skew through the receiver can also greatly vary. Therefore a receiver biasing circuit may be applied which can compensate for variations of the reference voltage so that an adapted biasing voltage can be supplied to the receiver and the receiver can provide a controlled skew of the data signal.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
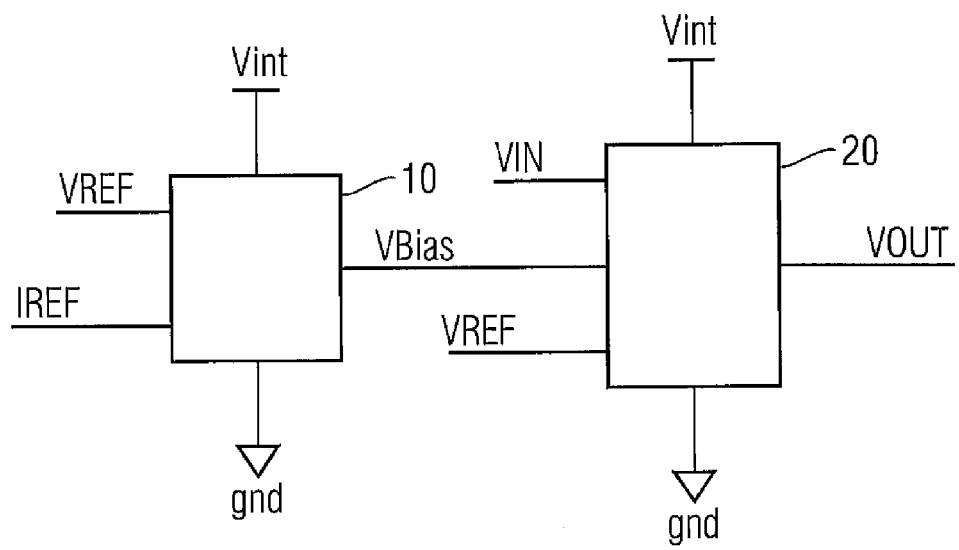
FIGS. 1A and 1B schematically illustrate block diagrams of a receiver unit having a receiver biasing block.
Figure 1B:
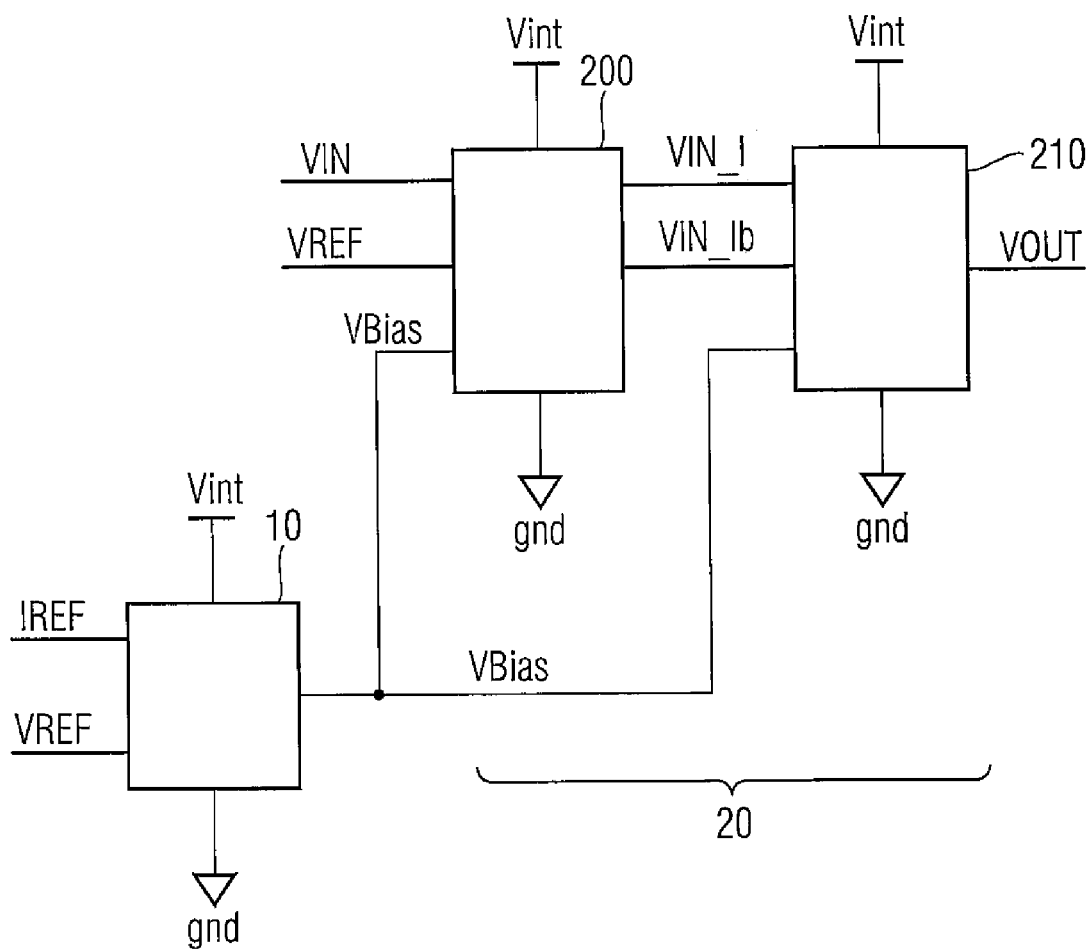

FIG. 1A illustrates a block diagram with a receiver biasing block 10 connected to a data signal receiver 20. The receiver biasing block 10 receives a receiver reference signal VREF and a reference current IREF and supplies a regulated bias signal VBias to receiver 20. Receiver 20 receives an input data signal VIN and the reference signal VREF, compares the two while using the regulated bias signal VBias to supply a biasing current. As it is illustrated in FIG. 1B and will be explained below with reference to FIGS. 3 and 4, receiver 20 is partitioned into a level shifter block 200 and an amplifier block 210. The amplifier block 210 of receiver 20 provides the data output signal VOUT in accordance with the input data signal VIN and the reference voltage VREF.

As illustrated in FIGS. 1A and 1B, both the receiver biasing block 10 and the receiver 20 are each supplied by a first and second supply voltage Vint and gnd. The first supply voltage Vint may be generated on the chip and has a regulated voltage level. As explained further below the second supply voltage gnd which may be a ground potential may vary, that is may be slightly different at the receiver biasing block 10 and at the receiver 20. It is further indicated in FIG. 1B that the level shifter block 200 outputs the level-shifted input signal as a differential input signal VIN_I and VIN_Ib to the amplifier block 210.

Figure 2:
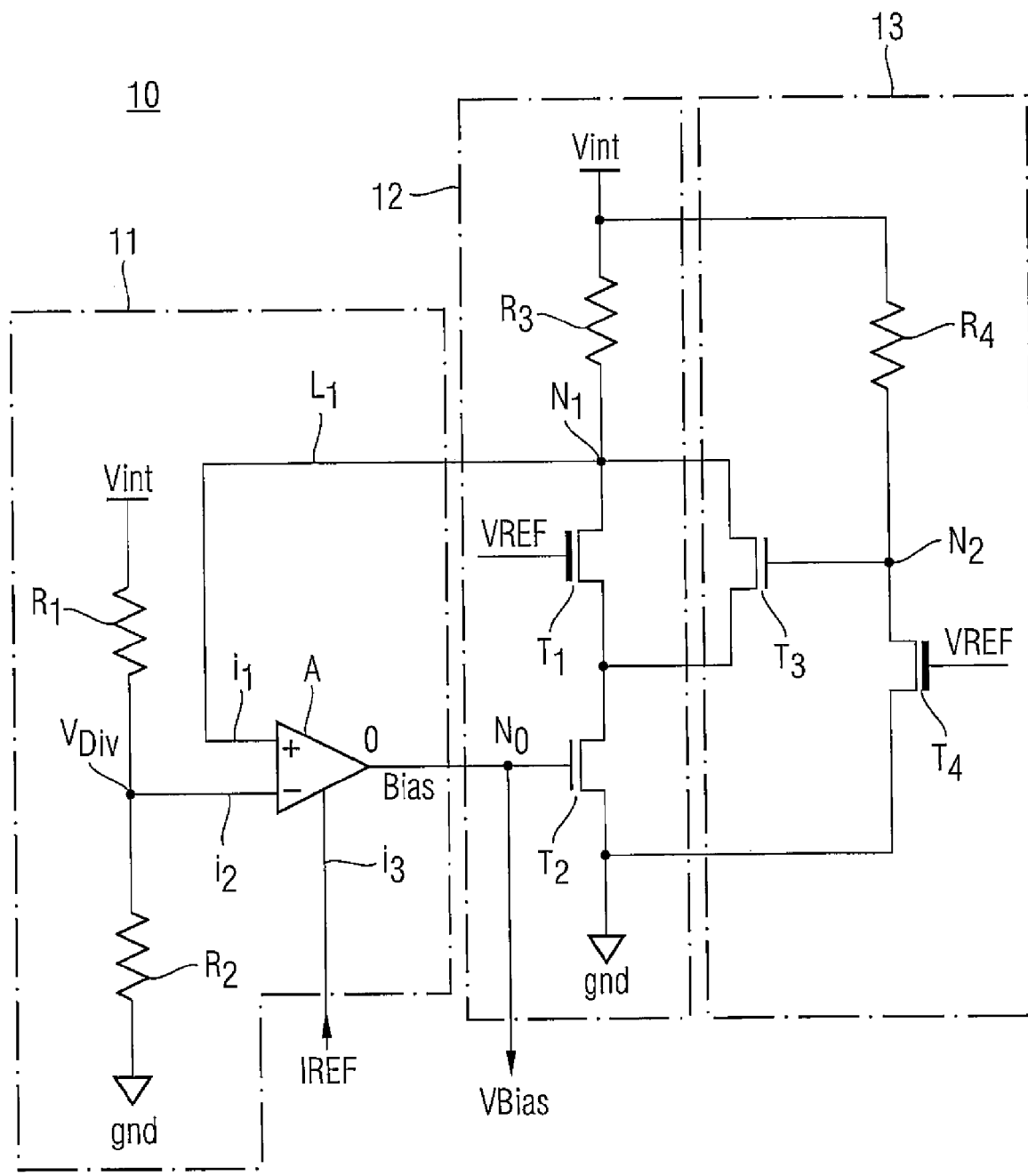
FIG. 2 illustrates a circuit diagram of a first embodiment of the receiver biasing circuit.

FIG. 2 illustrates a circuit of a first embodiment of a receiver biasing circuit 10.

As illustrated in FIG. 2 the receiver biasing circuit 10 of the first embodiment is arranged for generating a regulated bias voltage VBias to be supplied to a bias terminal of at least one data signal receiver which may be arranged for receiving a data input signal at a data input terminal thereof and comparing the same with a reference voltage VREF while being coupled between and supplied by a first regulated supply voltage Vint and a second supply voltage gnd and using the regulated bias voltage VBias generated by the receiver biasing circuit to supply a biasing current to the data signal receiver.

The receiver biasing circuit 10 has three functional circuit stages, namely a bias voltage regulating section (an amplifier circuit) 11, a receiver replica circuit 12 and a compensation circuit 13.

The bias voltage regulating section 11 includes an operational amplifier A having a first positive input i1, a second negative input i2 and an output o outputting the regulated bias voltage VBias to the bias terminal of the data signal receiver (not illustrated in FIG. 2). The operational amplifier A further has a reference current input terminal i3 receiving a reference current IREF which may be generated from any convenient current source. Further a voltage divider including the resistors R1 and R2 coupled at their outer ends between the first regulated supply voltage Vint and the second supply voltage gnd generates a divided voltage $V_{Div}$ which is applied to the negative input terminal of the operational amplifier A. In operation, the divided voltage $V_{Div}$ tracks the first regulated supply voltage Vint.

The second stage of the receiver biasing circuit forms a receiver replica circuit 12 being a replica of a first receiver stage as discussed further below. The receiver replica circuit 12 may be used to track parameter variations of the first receiver stage and variations of VREF. The receiver replica circuit 12 is coupled between the first regulated supply voltage Vint and the second supply voltage gnd, also receives the reference voltage VREF and has an input terminal N0 operationally connected to the output o of the bias voltage regulating section 11 and an output terminal N1 operationally connected to the at least one first input i1 of the operational amplifier A thereby forming a feedback loop L1 supplying a regulating feedback voltage to the at least one first input i1.

The receiver replica circuit 12 includes a first and second replica transistor T1 and T2 and a replica load resistor (first resistor) R3 which are serially connected between the first regulated supply voltage Vint and the second supply voltage gnd, and the gate terminal of the first replica transistor T1 receives the reference voltage VREF. A first drain/source terminal of the first replica transistor T1 is connected to one end of the replica load resistor R3 and forms an output terminal N1 of the receiver replica circuit 12. A second drain/source terminal of the first replica transistor T1 is connected to first drain/source terminal of the second replica transistor T2. The second drain/source terminal of the second replica transistor T2 is connected to the second supply voltage gnd. Further, a gate terminal of the second replica transistor T2 forms an input terminal N0 of the receiver replica circuit 12 and receives the regulated bias voltage VBias from the output o of the operational amplifier A of the bias voltage regulating section 11.

The first replica transistor T1 is a thick oxide device and the second replica transistor T2 of the receiver replica circuit 12 may be a thin oxide device. The first replica transistor T1 may be a thick oxide device as this belongs to the replica of the first stage (the level shifter block) of the data signal receiver as discussed further below and the gate terminal of the first replica transistor T1 may be directly connected to a pad of a semiconductor chip and hence subjected to high voltage during some high voltage operations and events. Being a thick oxide device the threshold voltage of the first replica transistor T1 may be high. In one embodiment, for low values of the reference voltage VREF, the effective voltage at the gate of the first replica transistor T1 is very low and hence the feedback voltage on the feedback loop L1 raises very high so that the loop in turn may not work properly.

Further the receiver biasing circuit as illustrated in FIG. 2 includes compensation circuit 13 also connected between the first regulated supply voltage Vint and the second supply voltage gnd in parallel to the receiver replica circuit 12 and to the output terminal N1 thereof. The compensation circuit 13 is controlled in accordance with the level of the reference voltage VREF for compensating the feedback voltage on the feedback loop L1 in case of the reference voltage VREF having a low level.

The compensation circuit 13 includes a compensation transistor (third transistor) T3 having first and second drain/source terminals respectively connected to the first and second drain/source terminals of the first replica transistor T1 of the receiver replica circuit 12 and a gate terminal. The compensation circuit 13 further includes a compensation control transistor (fourth transistor) T4 which is serially connected to a second load resistor R4, and a junction node N2 of a first drain/source terminal of the compensation control transistor T4 with one end of the second load resistor R4 is connected to the gate terminal of the compensation transistor T3. Further a second end of the second load resistor R4 and a second drain/source terminal of the compensation control transistor T4 are respectively connected to the first regulated supply voltage Vint and to the second supply voltage gnd, and a gate terminal of the compensation control transistor T4 receives the reference voltage VREF.

In one embodiment, as illustrated in FIG. 2 the compensation control transistor T4 is also a thick oxide device.

When the reference voltage VREF has a low level, the first replica transistor T1 of the receiver replica circuit 12 is weakly driven but the compensation control transistor T4 is also weakly driven and hence the voltage at the node N2 increases and the compensation transistor T3 compensates for the weak drive by the first replica transistor T1. The feedback voltage on the feedback loop L1 is therefore controlled and tracks the voltage $V_{Div}$ of the voltage divider R1, R2 of the bias voltage regulating section 11 hence providing a very well regulated bias voltage VBias being well compensated against low level variations of the reference voltage VREF.

When the level of the reference voltage VREF is high the first replica transistor T1 and the compensation control transistor T4 are strongly driven and hence feedback is quite well controlled and the voltage at the node N2 goes low and hence the compensation transistor T3 hardly contributes to the first replica transistor T1. This function may be helpful as it may be desired for the bias voltage to be lower for high reference voltage levels VREF and higher for lower reference voltage levels VREF and the introduction of the compensation circuit 13 negates this effect. That is, the compensation transistor T3 supports the first receiver replica transistor T1 when it is weakly driven and does not interfere the operation when the first replica transistor T1 supports itself.

Figure 3:
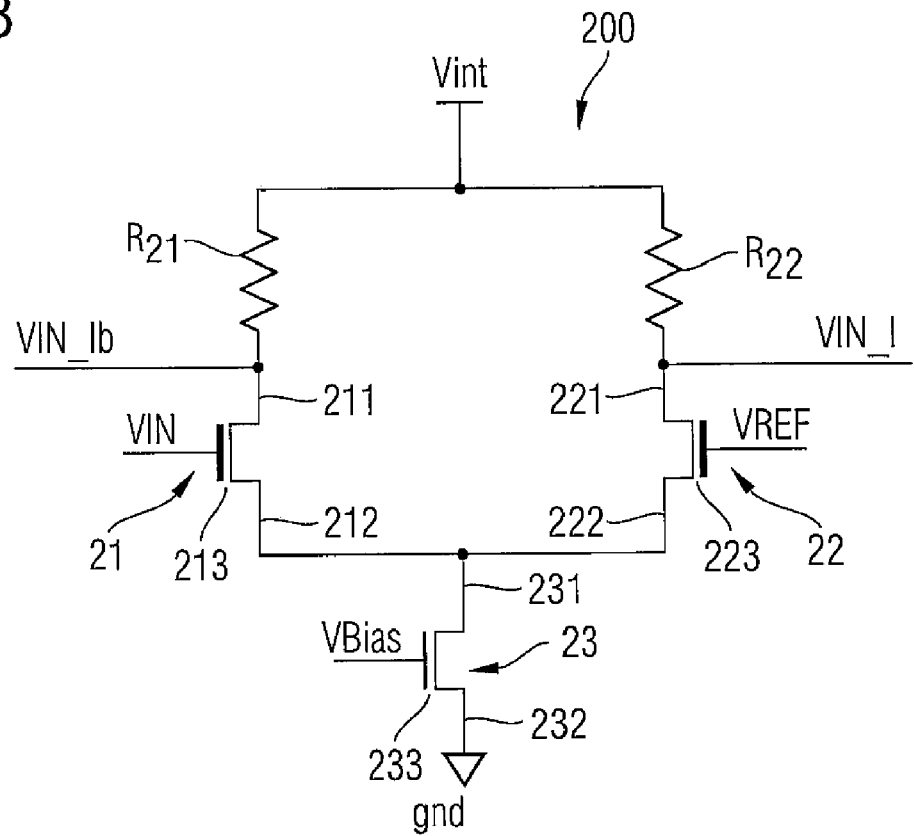
FIG. 3 illustrates a circuit diagram of a level shifter block being a first stage of a data signal receiver and being arranged as a differential level shifter circuit.
Figure 4:
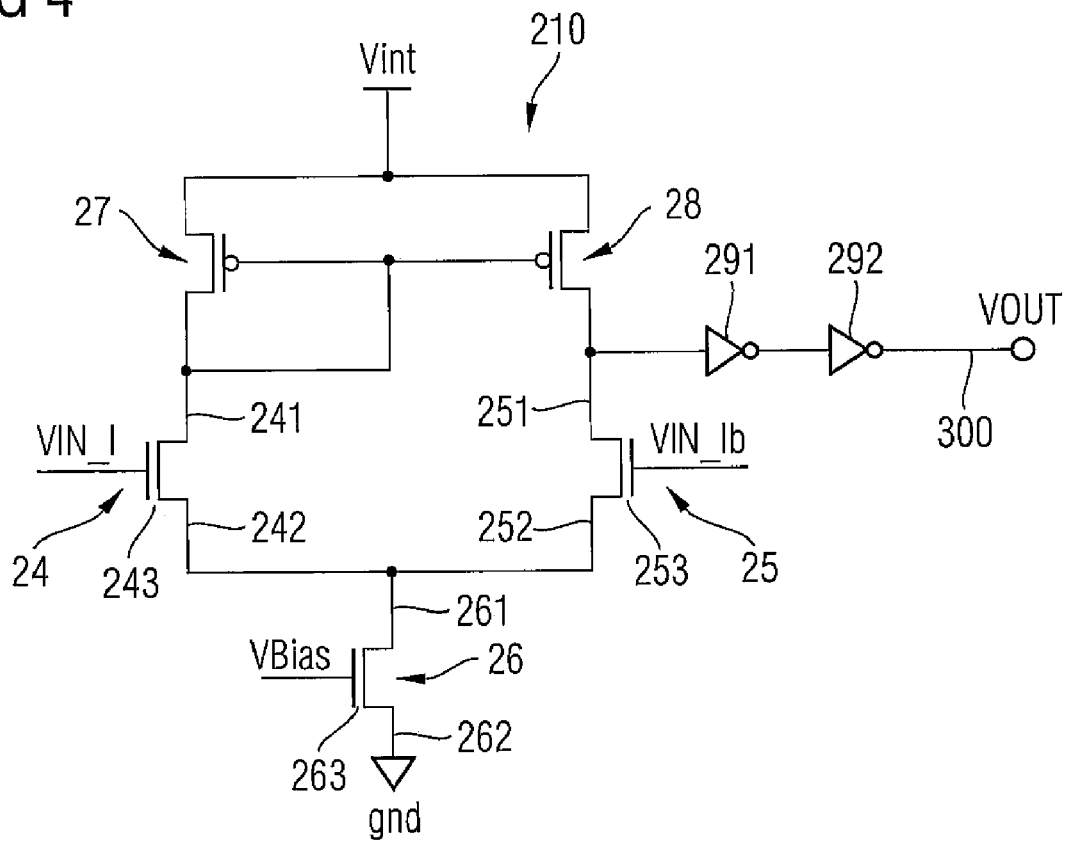
FIG. 4 illustrates a circuit diagram of an amplifier block being a second stage of the data signal receiver and being arranged as a differential amplifier.

A data signal receiver 20 (FIG. 1A) which is biased by the regulated bias voltage generated by the receiver biasing circuit described above includes a first circuit stage 200 the details of which are illustrated in FIG. 3 and having the function of a level shifter and a second circuit stage 210, the details of which are as illustrated in FIG. 4 having the function of an amplifier block.

According to FIG. 3 the first stage 200 of the data signal receiver 20 may have a first input transistor 21 and a second input transistor 22 and further a first biasing transistor 23. The first and the second input transistors 21 and 22 and the first biasing transistor 23 are arranged together in form of a differential amplifier which further includes a first resistor R21 and a second resistor R22 and is connected between and supplied by the first regulated supply voltage Vint and the second supply voltage gnd, respectively. The first regulated supply voltage Vint and the second supply voltage gnd may respectively have the same levels as the first and second supply voltages Vint and gnd supplied to the receiver biasing circuit 10 (FIG. 2). The first input transistor 21 receives at its gate terminal 213 an input data signal VIN having a first signal swing and outputs at a first drain/source terminal 211 thereof a first differential signal part VIN_Ib of a differential input data signal. The second input transistor 22 receives at its gate terminal 223 the reference voltage VREF and outputs at its first drain/source terminal a second differential signal part VIN_I of the differential input data signal. The first and second differential signal parts VIN_Ib and VIN_I have a second signal swing in accordance with the first regulated supply voltage Vint and the second supply voltage gnd. The first biasing transistor 23 has a first and second drain/source terminal 231, 232 and a gate terminal 233 connected to receive the regulated bias voltage VBias for supplying a bias current to the first and second input transistors 21 and 22. To this end the second drain/source terminals 212 and 222 of the first and second input transistors 21 and 22 are connected in common to the first drain/source terminal 231 of the first biasing transistor 23, the second drain/source terminal 232 of which is coupled to the second supply voltage gnd.

As illustrated in FIG. 4 the data signal receiver 30 further includes a second stage 210 arranged as a differential amplifier circuit and coupled sequentially to the first differential receiver circuit stage 200 (see FIG. 1B). The second stage 210 has a first and a second amplifier transistor 24 and 25 and a second biasing transistor 26. The first and second amplifier transistors 24 and 25 and the second biasing transistor 26 are arranged together in form of the differential amplifier which further includes a first and a second load transistor 27 and 28. This differential amplifier is connected between and supplied by the first regulated supply voltage Vint and the second supply voltage gnd, respectively.

The first and second amplifier transistors 24, 25 respectively have first and second drain/source terminals 241, 242 and 251, 252 and gate terminals 243 and 253 respectively arranged to receive the first differential signal part VIN_Ib and the second differential signal part VIN_I of the differential input data signal respectively from the first drain/source terminal 211 and 221 of the first and second input transistors 21 and 22 of the first receiver stage 200. Further, the second biasing transistor 26 has first and second drain/source terminals 261, 262 and a gate terminal 263 connected to receive the regulated bias voltage VBias for supplying a bias current to the first and second amplifier transistors 24 and 25, respectively. Further the first drain/source terminal 251 of the second amplifier transistor 25 outputs an amplified output signal in accordance with the received input data signal parts and has the second signal swing. This amplified output signal is two times inverted by a first and second inverter circuit 291 and 292 respectively connected in series to an output terminal 300 which outputs the output data signal VOUT. The second drain/source terminals 242 and 252 of the first and second amplifier transistors 24 and 25 are connected in common to the first drain/source terminal 261 of the second biasing transistor 26 while the second drain/source terminal thereof is coupled to the second supply voltage gnd.

The data signal receiver 20 having the first and second stages 200 and 210 as described above is connected to receive from the receiver biasing circuit 10 the regulated bias voltage VBias at the gate terminal 233 of the first biasing transistor 23 of the first data signal receiver stage 200, and at the gate terminal 263 of the second biasing transistor 26 of the amplifier stage 210.

FIG. 3 further illustrates that the first and second input transistors 21, 22 of the first data signal receiver stage 200 are thick oxide devices like the first receiver replica transistor T1 of the receiver biasing circuit 10.

The receiver biasing circuit described above as the first embodiment includes the compensation circuit 13 which is configured for compensating a weak drive of the first receiver replica transistor T1 when the reference voltage VREF has a low level. Therefore the data signal receiver biased with the regulated bias voltage VBias generated by the receiver biasing circuit 10 may reduce power consumption while maintaining high-speed reception of a data signal with low operating voltage. Further, the receiver biasing circuit 10 may help to achieve a high-speed reception of a data signal by the data signal receiver at low supply with a duty cycle compensation in the data signal receiver. Further, the combination of the data signal receiver 20 with the present biasing circuit 10 is compensated for a wide variation of the reference voltage VREF. Further, receiver biasing circuit 10 is adaptive to variations of all relevant parameters, namely resistance, MOS-process parameter variations, temperature variations and variations of the first regulated supply voltage Vint.

Figure 5:
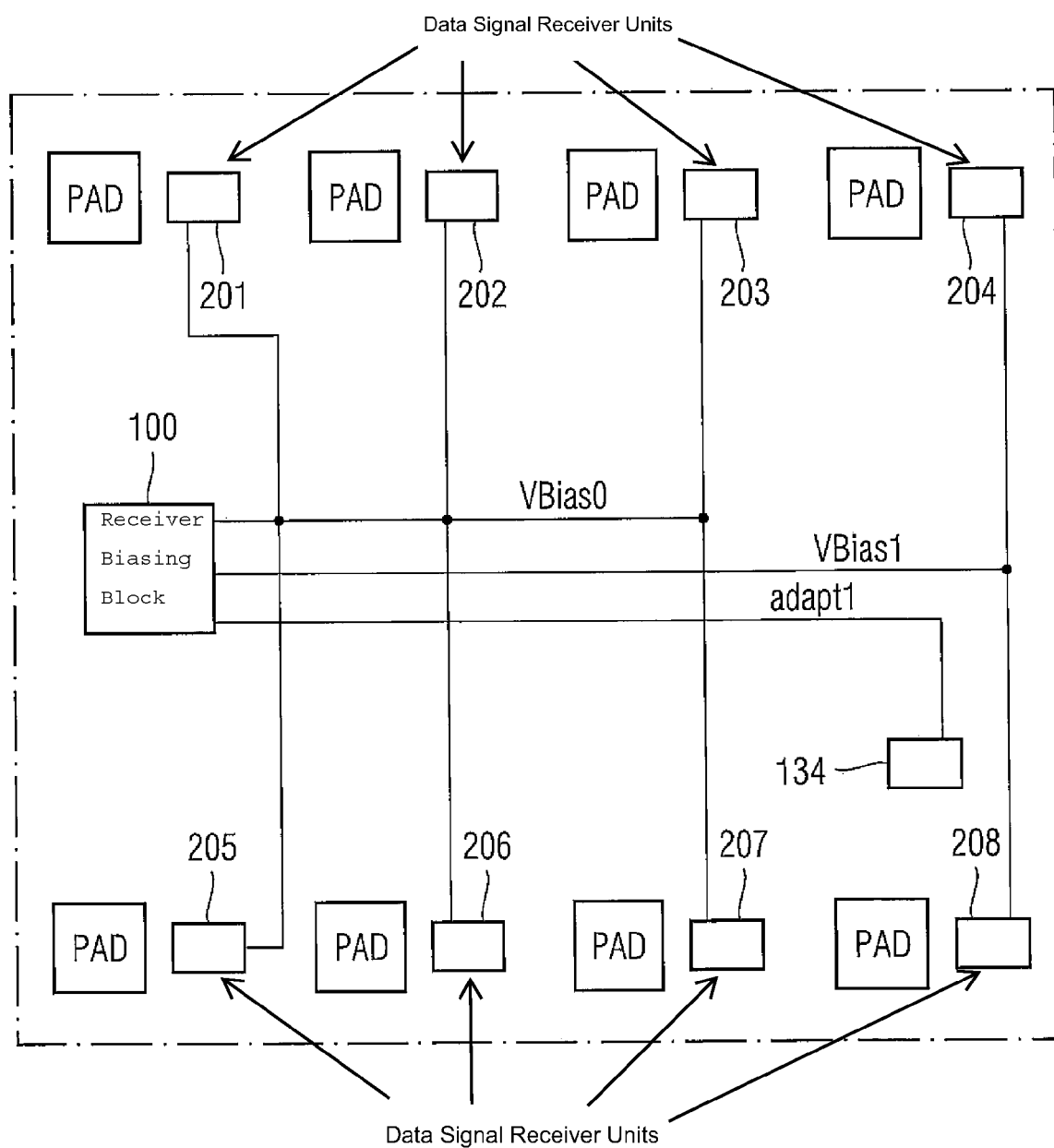
FIG. 5 illustrates a block diagram of an integrated circuit chip according to a second embodiment which illustrates a first receiver biasing scheme for a plurality of data signal receivers on the chip wherein the receiver biasing block is placed at the left side of the chip.

FIG. 5 illustrates a block diagram of an integrated circuit chip according to a third embodiment. On the chip a plurality of data signal receiver units 201, 202, . . . 208 each being at least comprised of the first data signal receiver stage 200 as illustrated in FIG. 3 and a receiver biasing block 100 are arranged. It should be noted, that the integrated circuit chip further includes a plurality of pads PAD respectively associated to a respective data signal receiver unit 201, 202, . . . , 208 and connected to the second input transistor 22 of the first receiver stage 200 thereof (cf. FIG. 3), to the first replica transistor T1 and to the compensation control transistor T4 (fourth transistor) of the receiver biasing circuit (cf. FIG. 2). In one embodiment, both the second input transistor 22 of the first receiver stage 200, the first replica transistor T1 of the receiver replica circuit 12 and the compensation control transistor T4 of the compensation circuit 13 of the receiver biasing circuit 10 are formed as thick oxide devices.

The biasing block 100 including the receiver biasing circuit 10 may consume a lot of power and a lot of chip area. Therefore, just one bias block 100 may be placed on the chip and route the biasing voltage VBias to each receiver 201, 202, . . . 208 on the chip. On the chip it may happen that the ground level (the level of the second supply voltage gnd) at the biasing block 100 is not the same as the ground level at, for example, the right most receivers 204 and 208. Since in this integrated semiconductor chip the biasing block 100 is placed at the leftmost side and two receivers 204 and 208 are placed on rightmost end of the chip, the voltage level of the second supply voltage gnd (e.g., the ground voltage level) at the receivers 204 and 208 may be different from the ground voltage level at the biasing block 100. The receivers 204 and 208 may therefore get an effective level of the bias voltage VBias which differs from the desired bias voltage level and hence these receiver units 204 and 208 may not function properly.

Therefore, a sensing unit or sensing means 134 may be provided, sending a message about the variation or the difference of the ground voltage level at one of the receiver units 204 and 208 to the bias block 100 via a signal adapt 1 so that the latter can generate a modified bias voltage level VBias1 to compensate for the ground level change. All other receiver units 201, 202, 203, 205, 206 and 207 receive the unmodified or desired bias voltage level VBias0. It can be appreciated by those of ordinary skill in the art that a similar circuit scheme will be applicable when the bias block 100 is based at the extreme right side of the chip.

Figure 6:
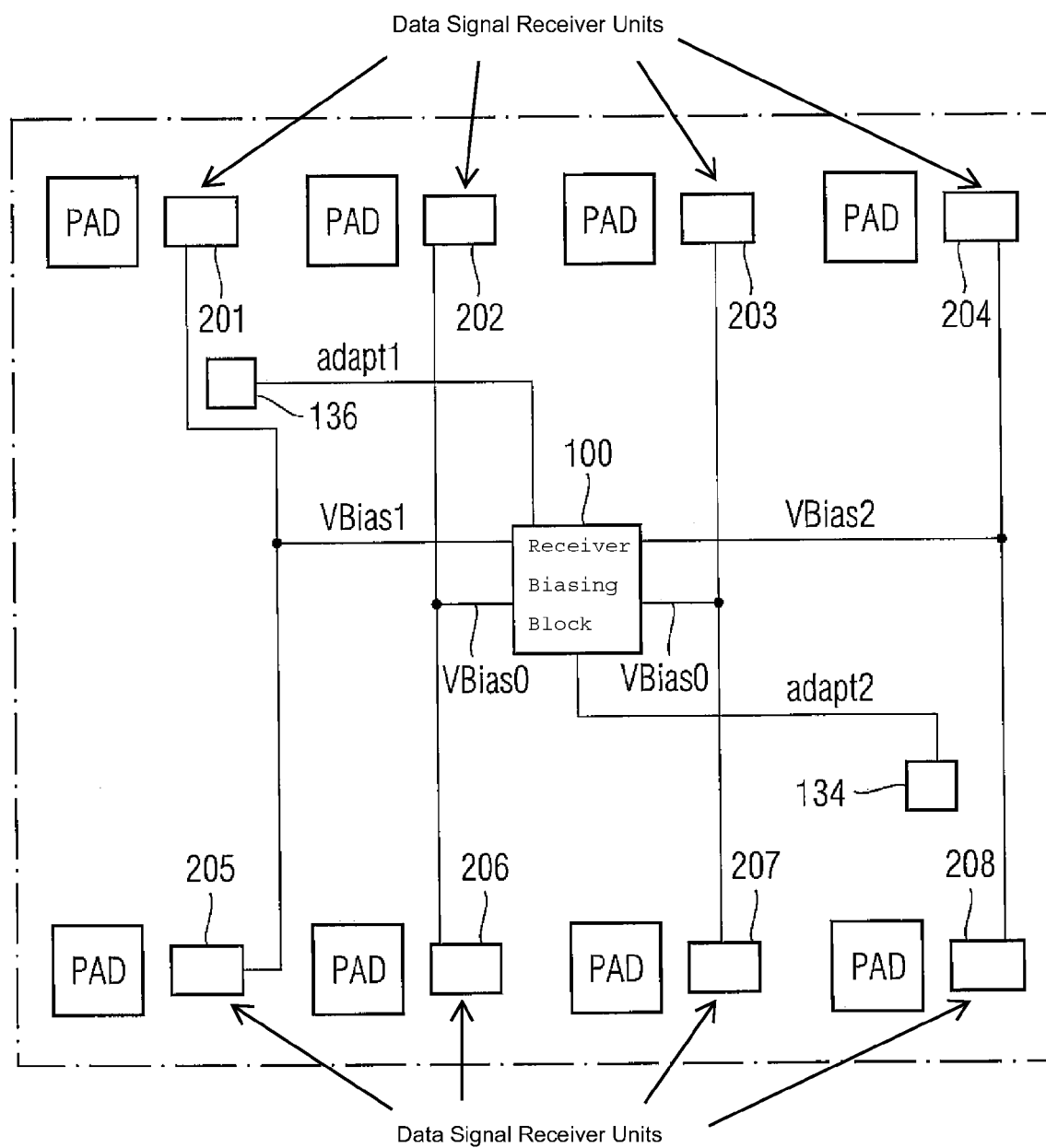
FIG. 6 illustrates a modification of the semiconductor chip according to the second embodiment embodying a second receiver biasing scheme which is a modification of the integrated chip according to FIG. 5 wherein the receiver biasing block is placed at a centre position on the chip.

A modification of the integrated circuit chip according to the second embodiment is illustrated in FIG. 6. In this modified integrated circuit chip the biasing block 100 is placed in the centre of the chip and generates in addition to the first (desired) bias voltage VBias0 two extra bias voltages VBias1 and VBias2 according to two adapt signals adapt1 and adapt2 respectively, which are provided from two sensor means 134 and 136, respectively. The first (desired) bias voltage VBias0 is supplied to those data signal receiver units 202, 203, 206 and 207 the second supply voltage level thereof, i.e. the ground voltage level has the same voltage level as the second supply voltage at the bias block 100. The first extra bias voltage VBias1 is routed to the two leftmost data signal receivers 201 and 205 and the second extra bias voltage VBias2 is routed to the two rightmost data signal receivers 204 and 208.

Figure 7:
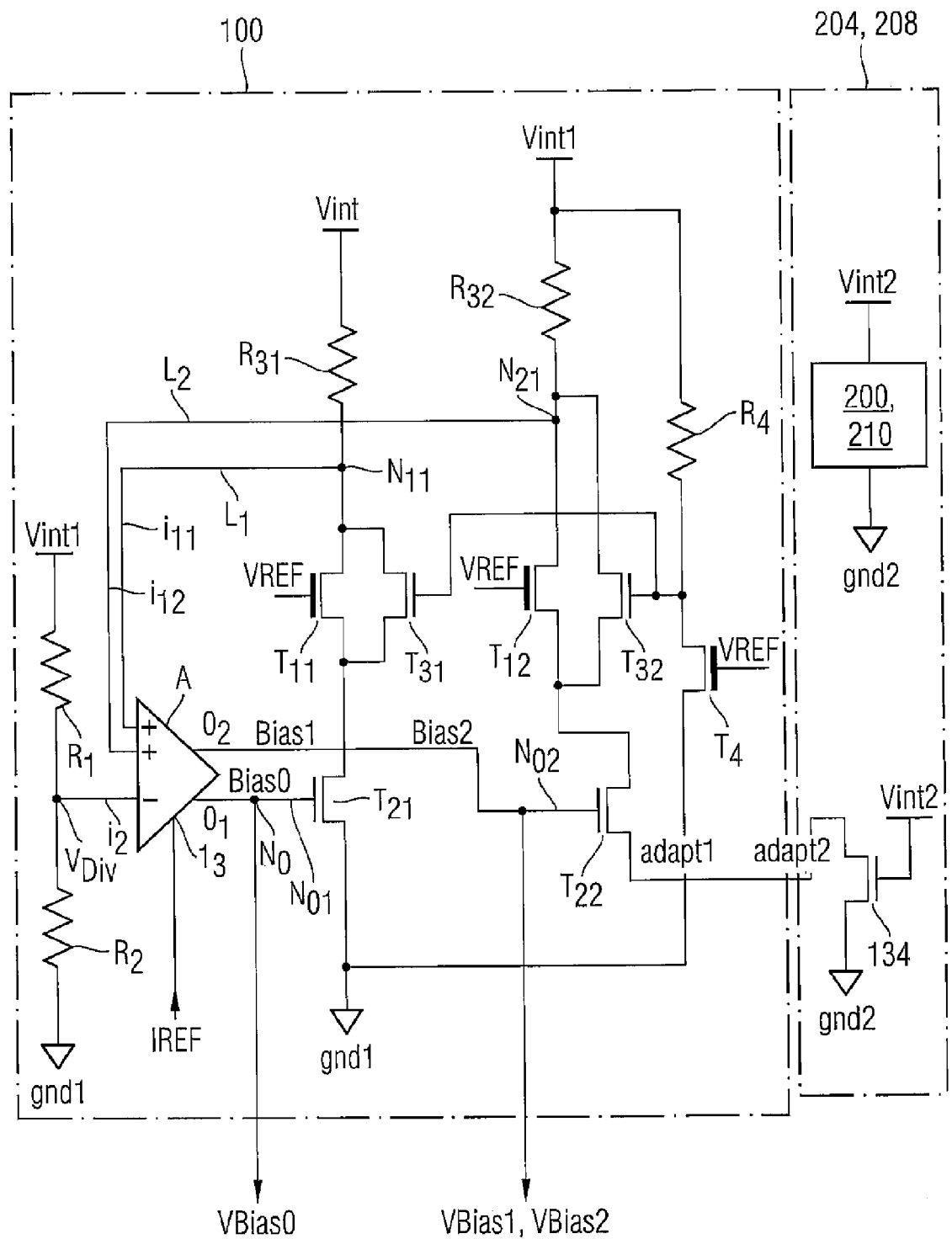
FIG. 7 illustrates a circuit diagram of a modification of the receiver biasing circuit according to the first embodiment for supporting the biasing schemes according to the FIGS. 5 and 6.
Figure 8A:
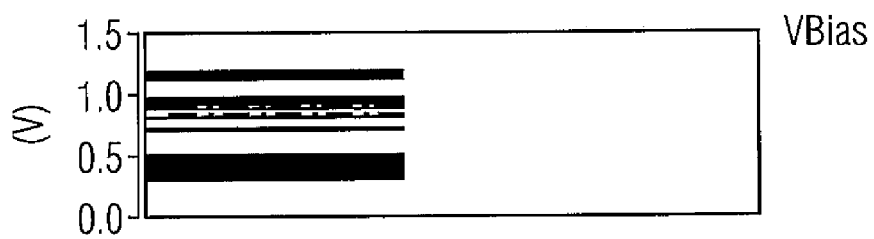
FIG. 8 illustrates a graphical representation of simulation waveforms of a typical receiver biasing circuit for comparison use only.
Figure 8B:
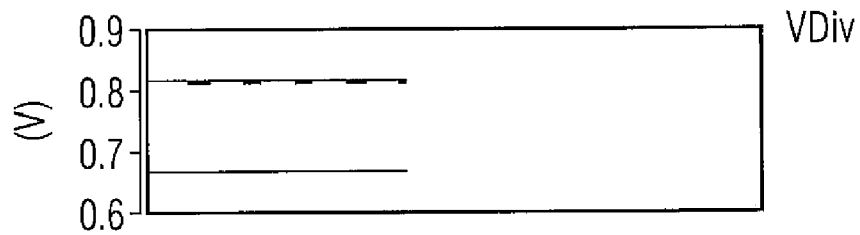
Figure 8C:
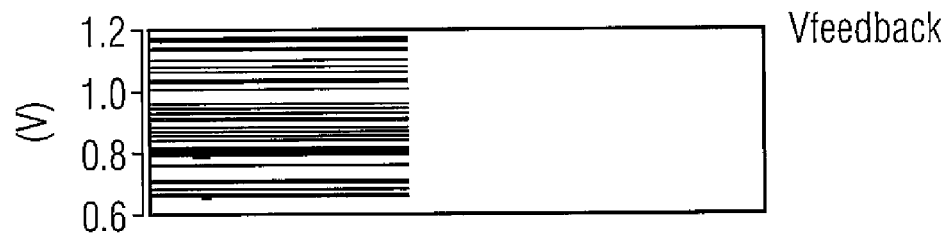
Figure 8D:
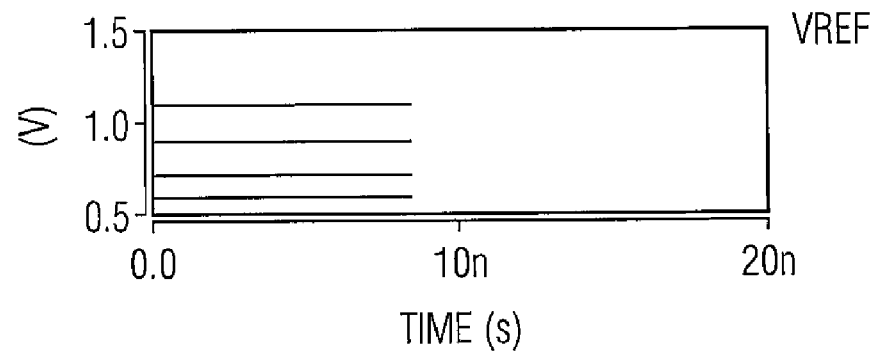
Figure 9A:
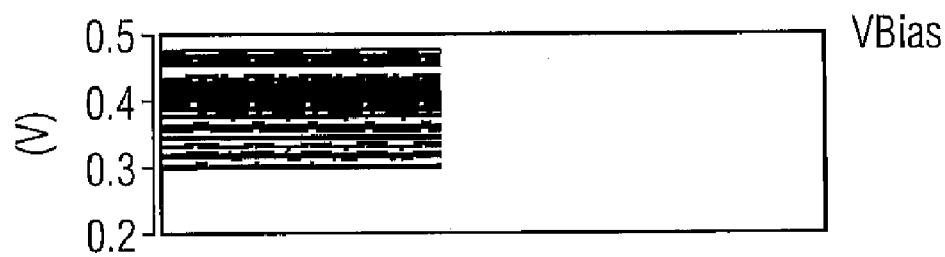
FIG. 9 graphically illustrates simulation results for the receiver biasing circuit according to the first embodiment as illustrated in FIG. 2.
Figure 9B:
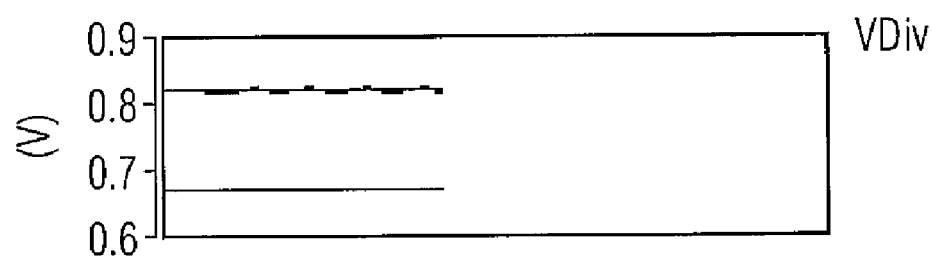
Figure 9C:
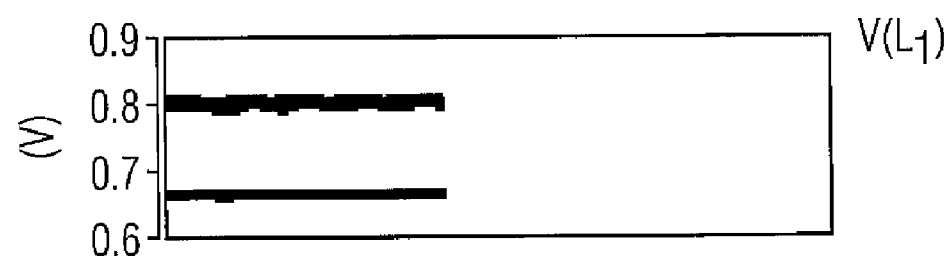
Figure 9D:
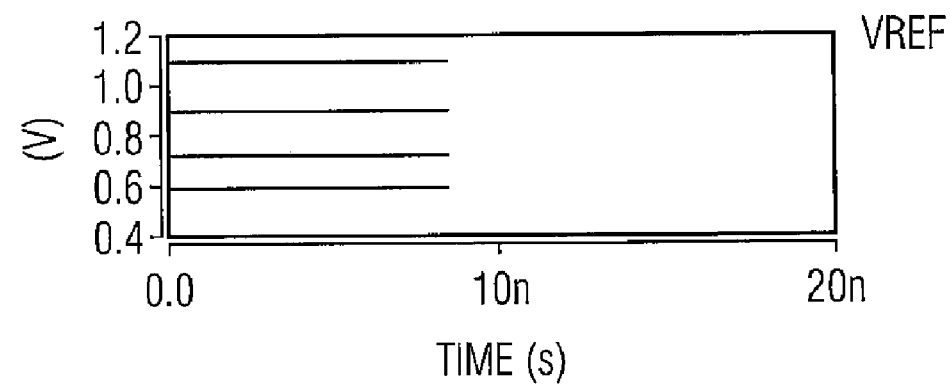
Figure 10A:
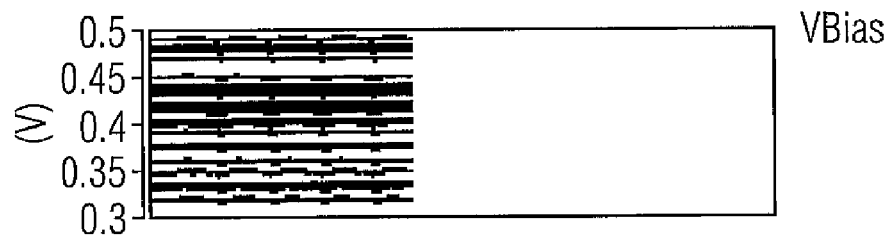
FIG. 10 graphically illustrates simulation results for a receiver biasing circuit according to the modification of the first embodiment as illustrated in FIG. 7.
Figure 10B:
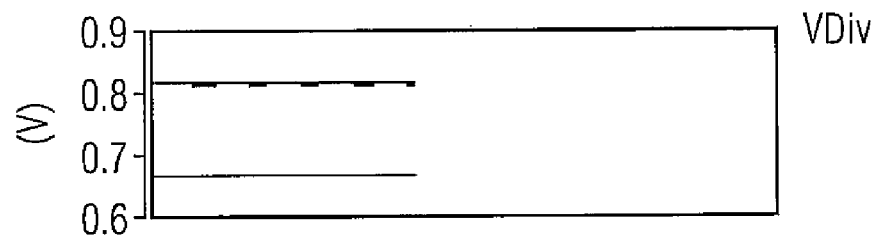
Figure 10C:
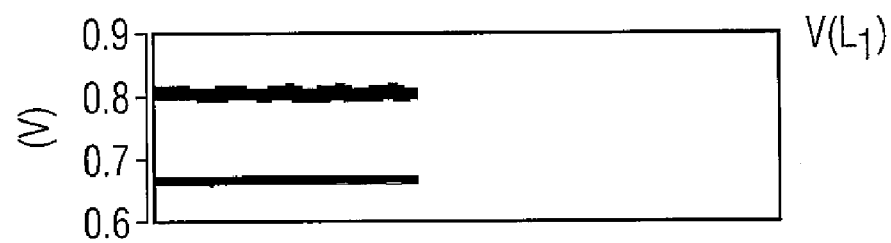
Figure 10D:
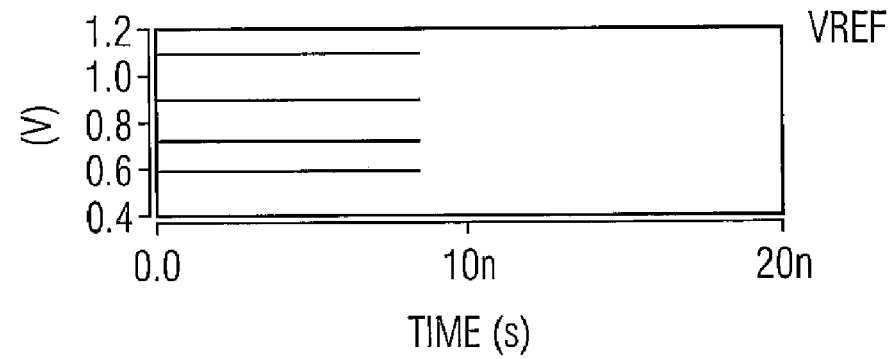

FIG. 7 illustrates a modification of the receiver biasing circuit as embodied by the biasing block 100 and configured to generate and supply the different bias voltage levels VBias0, VBias1, VBias2 supporting the biasing schemes of the integrated circuit chips according to FIGS. 5 and 6, respectively. gnd1 designates the desired level of the second supply voltage, i.e., the ground voltage at the bias block 100 and gnd2 designates the ground voltage level at the receiver units 204 and/or 208 placed at a distance from the bias block 100. The modified receiver biasing circuit illustrated in FIG. 7 is therefore arranged for generating at least two different regulated bias voltages VBias0 and VBias1 and/or VBias2 in accordance with at least two different levels of the second supply voltage gnd1, gnd2 present at least two of the data signal receiver units (for example data signal receiver units 203 and 204 or 207 and 208) on the integrated circuit chip.

The first regulated bias voltage VBias0 is generated very similar to the regulated bias voltage VBias generated by the receiver biasing circuit 10 according to FIG. 2. The generation of the second bias voltage VBias1 or the third bias voltage VBias2 depends on the voltage message signals adapt1 or adapt2 which are generated by the sensor means 134, 136 placed in vicinity of the receiver unit 208 and 201 in accordance with the different ground levels thereof, namely gnd2.

According to FIG. 7 the bias voltage regulating section of the receiver biasing circuit 100 includes an operational amplifier A having at least two positive input terminals i11, i12 and one negative input terminal i2 which is connected in the similar manner as the negative input of the operational amplifier A in the bias voltage regulating section 11 according to FIG. 2 and receives the divided voltage $V_{Div}$. The operational amplifier A further includes two outputs o1 and o2 respectively supplying the first regulated bias voltage VBias0 and the second (modified) bias voltage VBias1 or VBias2.

The modified receiver biasing circuit 100 according to FIG. 7 includes two receiver replica circuits each including a replica of a part (the receiver level shifting block 200) of a respective one of at least two data signal receivers on the integrated circuit chip. A first input terminal N01 of the first receiver replica circuit is connected to the first output o1 of the operational amplifier A and a second input terminal N02 of the second receiver replica circuit is connected to the at least one second output o2 of the operational amplifier A of the bias voltage regulating section. Further the two receiver replica circuits respectively have an output N11 and N21 which are respectively connected to one of the at least two first inputs i11, i12 of the operational amplifier A and thereby form two feedback loops L1 and L2 to the bias voltage regulating section. Each of the first and second receiver replica circuits of the receiver biasing circuit 100 according to FIG. 7 includes first and second replica transistors T11 and T21, T12 and T22, respectively and a load resistor R31 and R32. The first and second replica transistors and the load resistors thereof of each receiver replica circuit are connected in a similar manner as the receiver replica circuit 12 in the receiver biasing circuit 10 according to FIG. 2. However the second supply voltage gnd of the first receiver replica circuit is the desired ground level gnd1 which is actually present in the left side region of the chip according to FIG. 5 or in the centre region of the chip according to FIG. 6 where the biasing block 100 is placed. The second replica transistor T22 of the second receiver replica circuit however receives the voltage message signals adapt1 or adapt2 according to the different level gnd2 of the second supply voltage provided by the sensor means 136 and/or 134, respectively.

Further in the modified receiver biasing circuit illustrated in FIG. 7 the compensation circuit is connected in common and in parallel to both receiver replica circuits and to their output terminals N11 and N21. This compensation circuit includes two compensation transistors T31, T32 each one coupled in parallel to the first receiver replica transistors T11 and T12 of the first and second receiver replica circuits, respectively. The gate terminals of both compensation transistors T31, T32 are connected in common to a first drain/source terminal of a compensation control transistor T4 which is serially connected with a second load resistor R4. A junction node of a first drain/source terminal of the compensation control transistor T4 with one end of the second load resistor R4 is connected in common to the gate terminals of each of the compensation transistors T31 and T32, the second end of the second load resistor R4 is connected to the first regulated supply voltage Vint and a second drain/source terminal of the compensation control transistor T4 is connected to the desired level gnd1 of the second supply voltage. The gate terminal of the compensation control transistor T4 receives the reference voltage VREF. Also in the case of the modified receiver biasing circuit 100 as illustrated in FIG. 7 the first replica transistors T11 and T12 of the receiver replica circuits and the compensation control transistor T4 of the compensation circuit are thick oxide devices because their gate terminals receive the reference voltage VREF from a pad on the chip.

The operation of the modified receiver biasing circuit 100 is now described. Whenever the level gnd2 raises, the voltage level on the line adapt1 or adapt2 also arises. Hence current drive of the second replica transistor T22 of the second receiver replica circuit gets lowered and hence the voltage at the feedback node N21 raises hence increasing the voltage level at the second output o2 of the operational amplifier A, that is the bias voltages VBias1 or VBias2. Similarly, when the message voltage adapt1 or adapt2 decreases, the regulated bias voltage VBias1, VBias2 also decreases and provides the required gate-source voltage to the transistors of the data signal receivers 201, 205, 204 and 208 (cf. FIG. 6). Accordingly, by providing only the one bias block 100 on the chip, the chip area is reduced.

The signal waveforms in FIGS. 8 to 10 graphically illustrate simulation results of relevant voltage levels (lines A-D), namely in FIG. 8 for a typical biasing circuit used as a comparison example, in FIG. 9 for the receiver biasing circuit 10 according to the first embodiment (cf. FIG. 2) and in FIG. 10 for the receiver biasing circuit 100 according to the modification illustrated in FIG. 7. In FIGS. 8 to 10, part A illustrates the behavior of the bias voltage VBias over time (nanoseconds), part B illustrates the behavior of the divided voltage $V_{div}$ over time, part C illustrates the behavior of the feedback voltage Vfeedback over time and part D illustrates the variation of the reference voltage VREF over time. The simulations were performed using T58 parameter set with the following inputs:

1. Vint=1.0 V-1.2 V;
2. external power supply Vext=1.3 V-2 V;
3. gnd=0 V;
4. VREF varies from 0.45 Vext to 0.55 Vext;

5. transistor parameters
nom m range_2.0σ_snsp, m range_2.0σ_snfp, m range_2.0σ_fnsp, m range_2.0σ_fnfp;
 6. resistor parameters: headres_slow, headres_fast
 7. temperature −40° C.-115° C.

From the simulation waveforms of the comparison example illustrated in FIG. 8 it can be observed from part C that the feedback loop is not working for several levels of the reference voltage VREF (part D) and that the regulated bias voltage VBias thereby raises to the internal supply voltage Vint and hence the receiver biasing circuit and the data signal receivers consume too much current.

In comparison with the simulation waveforms in FIG. 8, FIG. 9 which illustrates the simulation results for the receiver biasing circuit 10 according to the first embodiment (FIG. 2) illustrates in part C (feedback voltage on loop L1) that the feedback functions quite well. The feedback voltage V on the loop L1 quite well tracks the divided voltage $V_{Div}$, and the level of the bias voltage VBias remains in the region from 0.3 V to 0.5 V (part A).

Also the simulation waveforms illustrated in FIG. 10 illustrate in comparison with those illustrated in FIG. 8 that the loop of the receiver biasing circuit according to the modified first embodiment (FIG. 7) functions quite well. The feedback voltage, for example on the feedback loop L1 as illustrated in part C quite well tracks the divided voltage $V_{DIV}$ (part B). It can also be observed from the simulation results in FIG. 10 that the bias voltage VBias raises so that the gate-source-voltage of the transistor of the data signal receiver getting the bias voltage VBias is sufficient to provide sufficient drive.

Obviously, many modifications and variations of the embodiments of the receiver biasing circuit, the data signal receiver and the integrated circuit chip as described in this specification are possible in light of the above description. It is therefore to be understood that within the scope of the appended claims the invention may be practiced otherwise than as specifically described for the embodiments.

A further embodiment provides a method of generating a regulated bias signal for biasing a data signal receiver. The method includes: providing a replica of at least a part of the data signal receiver;
supplying first and second supply voltages to the at least part of the data signal receiver and to the replica thereof, respectively; generating using the replica a feedback signal which depends on a reference signal of the data signal receiver; compensating an influence of the reference signal on the feedback signal when the reference signal has a low level; and regulating and outputting the bias signal based on the compensated feedback signal.

In the present method the compensation is carried out on the basis of a compensation signal having a value which increases when the reference signal decreases and decreases when the reference signal increases.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
 a replica circuit configured to generate a feedback signal, wherein the replica circuit is a replica of at least a part of a data signal receiver, and wherein the feedback signal depends on a reference signal of the data signal receiver;
 a compensation circuit connected to an output of the replica circuit and configured to compensate an influence of the reference signal on the feedback signal; and
 an amplifier circuit connected to the replica circuit and configured to generate a bias signal based on the feedback signal, the bias signal being provided to the data signal receiver
 a further replica circuit configured to generate a further feedback signal, wherein the further replica circuit is a replica of at least a part of a further data signal receiver, and wherein the further feedback signal depends on the reference signal; and
 a further compensation circuit configured to compensate an influence of the reference signal on the further feedback signal.

2. The integrated circuit of claim 1, wherein the replica circuit comprises a first transistor configured to be controlled by the reference signal.

3. The integrated circuit of claim 2, wherein the compensation circuit comprises a second transistor connected in parallel to the first transistor.

4. The integrated circuit of claim 3, comprising wherein a gate signal of the second transistor decreases if the reference signal increases and increases if the reference signal decreases, respectively.

5. The integrated circuit of claim 4, comprising wherein the first and second transistors are configured to provide the feedback signal at their drains or sources.

6. The integrated circuit of claim 4, wherein the compensation circuit comprises a third transistor configured to control the gate signal.

7. The integrated circuit of claim 6, comprising wherein the third transistor is controlled by the reference signal.

8. The integrated circuit of claim 7, comprising wherein the third transistor is connected in series with a resistor.

9. The integrated circuit of claim 3, wherein the replica circuit further comprises a fourth transistor and a resistor, both connected in series with the first transistor.

10. The integrated circuit of claim 1, comprising:
 a data signal receiver configured to process a data signal depending on the reference signal and the bias signal.

11. The integrated circuit of claim 10, wherein the data signal receiver comprises a differential amplifier and the replica circuit is a replica of at least part of the differential amplifier.

12. The integrated circuit of claim 11, comprising wherein the differential amplifier is configured to compare the data signal and the reference signal depending on the bias signal.

13. The integrated circuit of claim 1, comprising wherein the amplifier circuit is further configured to generate a further bias signal based on the further feedback signal, the further bias signal being provided to the further data signal receiver.

* * * * *